United States Patent
Jeong

(10) Patent No.: US 10,236,139 B2
(45) Date of Patent: Mar. 19, 2019

(54) SWITCH AND METHOD FOR MANUFACTURING THE SAME

(71) Applicant: Hyundai Motor Company, Seoul (KR)

(72) Inventor: Min Gun Jeong, Seoul (KR)

(73) Assignee: Hyundai Motor Company, Seoul (KR)

( * ) Notice: Subject to any disclaimer, the term of this patent is extended or adjusted under 35 U.S.C. 154(b) by 120 days.

(21) Appl. No.: 15/219,464

(22) Filed: Jul. 26, 2016

(65) Prior Publication Data
US 2017/0178837 A1    Jun. 22, 2017

(30) Foreign Application Priority Data
Dec. 22, 2015  (KR) .......................... 10-2015-0184102

(51) Int. Cl.
*H01H 13/52*  (2006.01)
*C09D 5/24*   (2006.01)
(Continued)

(52) U.S. Cl.
CPC .............. *H01H 13/52* (2013.01); *C09D 5/24* (2013.01); *C09D 167/00* (2013.01); *H01H 1/027* (2013.01); *H01H 3/12* (2013.01); *H01H 13/023* (2013.01); *C08K 3/04* (2013.01); *C08K 5/3435* (2013.01); *C08K 2003/0806* (2013.01); *C08K 2201/001* (2013.01); *C08K 2201/002* (2013.01); *H01H 2201/032* (2013.01); *H01H 2201/036* (2013.01); *H01H 2215/008* (2013.01); *H01H 2229/002* (2013.01); *H01H 2229/004* (2013.01); *H01H 2229/058* (2013.01); *H01H 2231/016* (2013.01); *H01H 2231/026* (2013.01); *H01H 2239/074* (2013.01); *H01H 2239/078* (2013.01); *H03K 2017/9602* (2013.01)

(58) Field of Classification Search
CPC .......... H01H 13/52; H01H 1/027; H01H 3/12; H01H 13/023; H01H 2201/032; H01H 2201/036; H01H 2215/008; H01H 2229/002; H01H 2229/004; H01H 2229/058; H01H 2231/016; H01H 2231/026; H01H 2239/074; H01H 2239/078
See application file for complete search history.

(56) References Cited

U.S. PATENT DOCUMENTS

| | | | |
|---|---|---|---|
| 9,570,245 B2 * | 2/2017 | Noda ................... | C22C 1/0425 |
| 2003/0006701 A1 * | 1/2003 | Hanahara ............. | H01H 13/702 313/512 |
| 2007/0182457 A1 * | 8/2007 | Yasuda ................ | H01H 13/704 327/1 |

FOREIGN PATENT DOCUMENTS

| CN | 101874275 A | 10/2010 |
|---|---|---|
| CN | 203054806 U | 7/2013 |

(Continued)

*Primary Examiner* — Edwin A. Leon
(74) *Attorney, Agent, or Firm* — Mintz Levin Cohn Ferris Glovsky and Popeo, P.C.; Peter F. Corless

(57) ABSTRACT

Shown are a switch and a manufacturing method thereof. The switch has a base substrate; and an electrode disposed on a first surface or a second surface of the base substrate. The flexible electrode includes: a substrate in a range of about 5 to 70 vol %; conductive particles embedded in the substrate in a range of about 29.9 to 94.9 vol %; and a degradation inhibitor in a range of 0.1 to 1 vol %, based on a total of 100 vol % of the electrode. In particular, the substrate of the electrode is flexible and thus the electrode is flexible.

8 Claims, 5 Drawing Sheets

(51) Int. Cl.
    *C09D 167/00*     (2006.01)
    *H01H 1/027*     (2006.01)
    *H01H 3/12*     (2006.01)
    *H01H 13/02*     (2006.01)
    C08K 3/04     (2006.01)
    C08K 5/3435     (2006.01)
    C08K 3/08     (2006.01)
    H03K 17/96     (2006.01)

(56) References Cited

FOREIGN PATENT DOCUMENTS

| | | |
|---|---|---|
| CN | 103729100 A | 4/2014 |
| EP | 1739692 A1 | 1/2007 |
| JP | 2010-186642 A | 8/2010 |
| KR | 2001-0062774 A | 7/2001 |
| KR | 10-2003-0035257 A | 5/2003 |
| KR | 10-2008-0045074 A | 5/2008 |
| KR | 10-2011-0089875 A | 8/2011 |
| TW | 201013708 A | 4/2010 |
| WO | 2005/104141 A1 | 11/2005 |
| WO | 2010/058928 A3 | 9/2010 |

\* cited by examiner

SWITCH AND METHOD FOR MANUFACTURING THE SAME

CROSS-REFERENCE TO RELATED APPLICATION

This application claims priority to and the benefit of Korean Patent Application No. 10-2015-0184102 filed in the Korean Intellectual Property Office on Dec. 22, 2015, the entire contents of which are incorporated herein by reference.

BACKGROUND OF THE INVENTION (a) Field of the Invention

This relates to a switch and a manufacturing method thereof.

(b) Description of the Related Art

For a typical mechanical switch, a switch may operate in a vertical direction by a pressure to contact an electrical contact, such that the mechanical switch may have a large volume and a complex structure.

A touch switch operated by using capacitance has been developed to solve such problem. However, the touch switch having a flat shape or a fixed curved shape has been used by installing a metal electrode therein, which may be advantageous for simplification and thinning of the structure, but may be difficult to feel operation thereof when it is touched.

For this reason, in the related art, a haptic system using a vibration or a sound has been used to realize the operational feeling of the touch switch, which may be difficult to perceive a realistic button feeling and may have a disadvantage of requiring additional equipment such as an electric motor for the vibration.

Accordingly, studies on a switch that can realize ultra-thin thickness and can acquire an operational feeling or a button feeling of a switch button thereof have been continued.

The above information disclosed in this Background section is only for enhancement of understanding of the background of the invention and therefore it may contain information that does not form the prior art that is already known in this country to a person of ordinary skill in the art.

SUMMARY OF THE INVENTION

In preferred aspects, the present invention may provide a switch having a substantially reduced thickness, and a manufacturing method thereof, which can realize a button feel with an ultra-thin thickness and can use glass through a transparent configuration.

An exemplary embodiment of the present invention may provide a switch including: a base substrate; and an electrode disposed on a first surface or a second surface of the base substrate. Further, the electrode may include: a substrate in an amount in a range of 5 to 70 vol %; conductive particles embedded in the substrate in an amount in a range of 29.9 to 94.9 vol %; and a degradation inhibitor in an amount in a range of 0.1 to 1 vol %, based on a total of 100 vol % of the electrode. In particular, the substrate of the electrode may be flexible, and thus, the electrode may be flexible.

Further provided is the electrode may consist essentially of, essentially consist of, or consist of: the substrate in an amount in a range of 5 to 70 vol %; the conductive particles embedded in the substrate in an amount in a range of 29.9 to 94.9 vol %; and the degradation inhibitor in an amount in a range of 0.1 to 1 vol %, based on the total of 100 vol % of the electrode.

The term "flexible" is meant by easily being bent, modified, altered, or adjustable by a force or pressure without breaking thereby providing suitably physical properties (e.g. dimensional stability and flex resistance). In certain embodiments, the flexible substrate and the flexible electrode in the present invention may not be easily breakable as being bent, modified, altered or adjusted by a force applied thereon. Unless otherwise indicated herein, the substrate of the electrode, and the electrode in the present invention may be flexible thereby indicating respectively flexible substrate and flexible electrode.

In certain aspects, a thickness of the switch suitably may be in a range of about 0.5 to 3 mm.

The conductive particles may include one selected from the group consisting of carbon black, carbon nanotubes, graphene, fullerene, graphite, copper powder, silver powder, gold powder, nickel powder, and a combination thereof.

The base substrate may include one selected from the group consisting of silicone resins, acryl-based resins, polyethylene terephthalate (PET), polyvinyl chloride (PVC), polyethylene (PE), polycarbonate (PC), poly(methyl methacrylate) (PMMA), acrylonitrile butadiene styrene (ABS), polypropylene (PP), polyimide (PI), polyamide/imide (PAI), polyphthalamide (PPA), an epoxy resin, and a combination thereof.

The flexible substrate may include one or more selected from the group consisting of polyester, polyurethane, silicone, nitrile-butadiene rubber (NBR), polyethylene terephthalate (PET), and an oligomer or monomer thereof.

The degradation inhibitor may include one selected from the group consisting of a thioester-based compound, a hindered phenol-based compound, a hindered amine-based compound, a phosphite-based compound, and a combination thereof.

An exemplary embodiment of the present invention may provide a manufacturing method of a switch. The method may include: preparing a paste including a substrate, conductive particles, and a degradation inhibitor; coating the paste on a first surface or a second surface of the base substrate; and forming, by drying or curing the coated paste, an electrode on the first surface or the second surface of the base substrate.

The degradation inhibitor may include one selected from the group consisting of a thioester-based compound, a hindered phenol-based compound, a hindered amine-based compound, a phosphite-based compound, and a combination thereof in the preparing of the paste including the substrate, the conductive particles, and the degradation inhibitor.

The coating of the paste on the first surface or the second surface of the base substrate may be performed by using screen printing, printer printing, spray coating, dipping, or a combination thereof.

The forming of the electrode on the first surface or the second surface of the base substrate by drying or curing the coated paste may be performed by heat curing or photo-curing.

The conductive particles may include one selected from the group consisting of carbon black, carbon nanotubes, graphene, fullerene, graphite, copper powder, silver powder, gold powder, nickel powder, and a combination thereof.

The base substrate may include one selected from the group consisting of silicone resins, acryl-based resins, polyethylene terephthalate (PET), polyvinyl chloride (PVC), polyethylene (PE), polycarbonate (PC), poly(methyl methacrylate) (PMMA), acrylonitrile butadiene styrene (ABS), polypropylene (PP), polyimide (PI), polyamide/imide (PAI), polyphthalamide (PPA), an epoxy resin, and a combination thereof.

The substrate may include one or more selected from the group consisting of polyester, polyurethane, silicone, nitrile-butadiene rubber (NBR), polyethylene terephthalate (PET), and an oligomer or monomer thereof.

Further provided is a vehicle that may comprise the switch as described herein.

Other aspects of the invention are disclosed infra.

According to various exemplary embodiments of the present invention, a switch having substantially reduced thickness and a manufacturing method thereof may be provided, which can realize a button feel with an ultra-thin thickness and can use glass through a transparent configuration.

BRIEF DESCRIPTION OF THE DRAWINGS

It should be understood that the accompanying drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing The above and other objects, features and advantages of the present invention will be more clearly understood from the following detailed description taken in conjunction with the accompanying drawings.

<Description of Symbols>

| 1: flexible electrode | 2: base substrate |
| 3: flexible substrate | 4: conductive particle |
| 5: gap | |

DETAILED DESCRIPTION

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Hereinafter, exemplary embodiments of the present invention will be described. However, the exemplary embodiments are illustrative only and are not to be construed to limit the present invention, and the present invention is just defined by the scope of the claims as will be described below.

Figure 1:
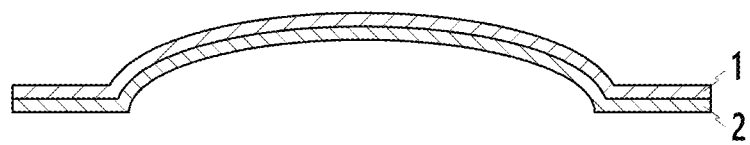
FIG. 1 illustrates an exemplary switch according to an exemplary embodiment of the present invention.
Figure 2:
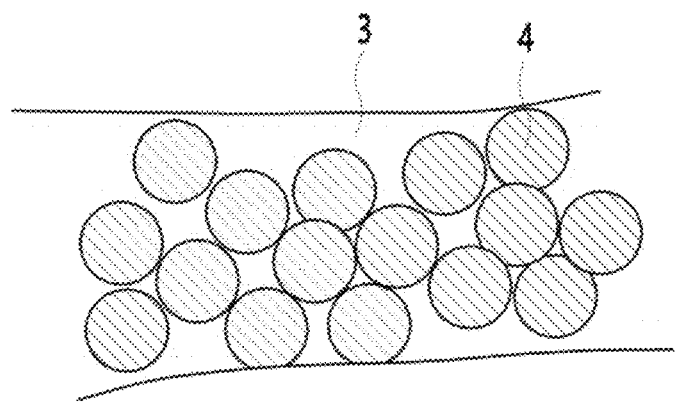
FIG. 2 illustrates an exemplary flexible electrode of a switch according to an exemplary embodiment of the present invention.
Figure 2:
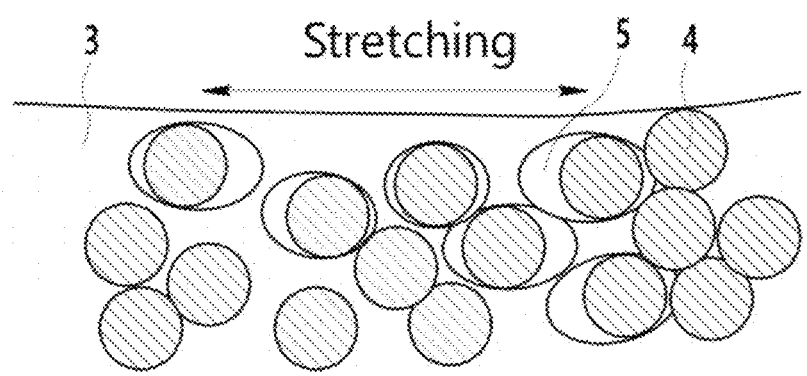

According to an exemplary embodiment of the present invention, as shown in FIG. 1 and FIG. 2, a switch or an ultra-thin switch including a base substrate 2 and an electrode (flexible electrode) 1 disposed on a first surface or a second surface of the base substrate 2 may be provided. The flexible electrode 1 may include a flexible substrate 3, conductive particles 4 included in the flexible substrate, and a degradation inhibitor. Based on the total of 100 vol % of the flexible electrode, the conductive particles may be included in an amount in a range of about 29.9 to 94.9 vol %, the flexible substrate may be included in an amount in a range of about 5 to 70 vol %, and the degradation inhibitor may be included in an amount in a range of about 0.1 to 1 vol %.

A thickness of the ultra-thin switch may be in a range of about 0.5 to 3 mm.

The base substrate may have various shapes such as a flat shape or a domelike shape, and the domelike shape may include a hemispherical shape, a trapezoidal shape, a triangular pyramidal shape, and the like, which may not be particularly limited.

The conductive particles may include one selected from the group consisting of carbon black, carbon nanotubes, graphene, fullerene, graphite, copper powder, silver powder, gold powder, nickel powder, and a combination thereof.

The base substrate may include one selected from the group consisting of silicone resins, acryl-based resins, polyethylene terephthalate (PET), polyvinyl chloride (PVC), polyethylene (PE), polycarbonate (PC), poly(methyl methacrylate) (PMMA), acrylonitrile butadiene styrene (ABS), polypropylene (PP), polyimide (PI), polyamide/imide (PAI), polyphthalamide (PPA), an epoxy resin, and a combination thereof.

The flexible substrate may include one selected from the group consisting of one or more selected from the group consisting of polyester, polyurethane, silicone, nitrile-butadiene rubber (NBR), polyethylene terephthalate (PET), and an oligomer or a monomer thereof.

In the ultra-thin switch according to the present exemplary embodiment, the flexible electrode may be formed of a polymer material including conductive particles such as carbon particles or metal particles. Accordingly, the switch may be manufactured to have a button feeling that may be applicable to various user environments and with ultra-thin thickness. Further, the electrode may be made in various shapes by using any flexible material and to use glass for a transparent configuration. Particularly, the ultra-thin switch according to the exemplary embodiment may be advantageously used for a vehicle. In particular, in the vehicle, it may be dangerous to find a position of the switch and manipulate the switch while the vehicle is in driving. Forming a protrusion in the switch to ameliorate such a risk may enable a driver to precisely find the position of the switch and manipulate the switch without interfering with the driver's attention.

Exemplary function of the ultra-thin switch will be described with reference to FIG. 2.

When an ON-OFF signal for determining an operation of the switch is generated, it is possible to use a stretching property of the flexible substrate 3 formed of a rubber or plastic material, including conductive particles 4 instead of an electrode-contact method or an electrostatic method. For example, when a plastic domelike structure (not shown in FIG. 2) to which an electrode material is attached may be stretched or compressed, the electrode may be also stretched or compressed, thereby being deformed in a range of about −20 to 20%. When such compression or stretching causes extension of the flexible substrate 3 formed of a rubber or plastic material, distances between the conductive particles 4 may be increased, thereby forming gaps 5. As a result, a predetermined resistance of the electrode material may be suddenly changed. At this time, the switch may be operated by detecting a thus-changed voltage or current value. In other words, the number of gaps 5 between the conductive particles 4 may be increased by the act of stretching of the rubber material, thereby increasing the specific resistance of the material. Accordingly, the switch may be operated by using a different voltage or current.

For the base substrate of the ultra-thin switch and the flexible electrode, a material type and a shape may be selected. As consequence, for example, a transparent sheet type of switch structure, a translucent sheet type of switch structure, or an opaque sheet type of switch structure, may be obtained.

Figure 4:
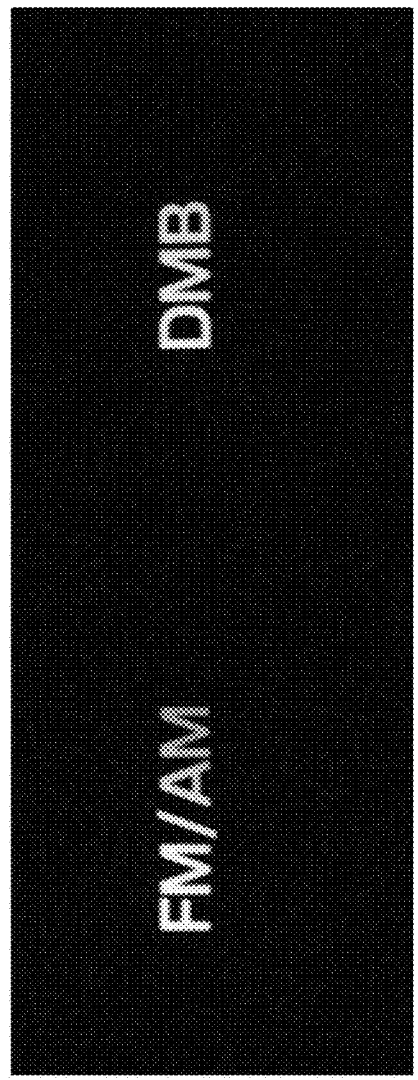
FIG. 4 is a photograph of a light-emission test result of an exemplary switch according to an exemplary embodiment of the present invention.
Figure 5:
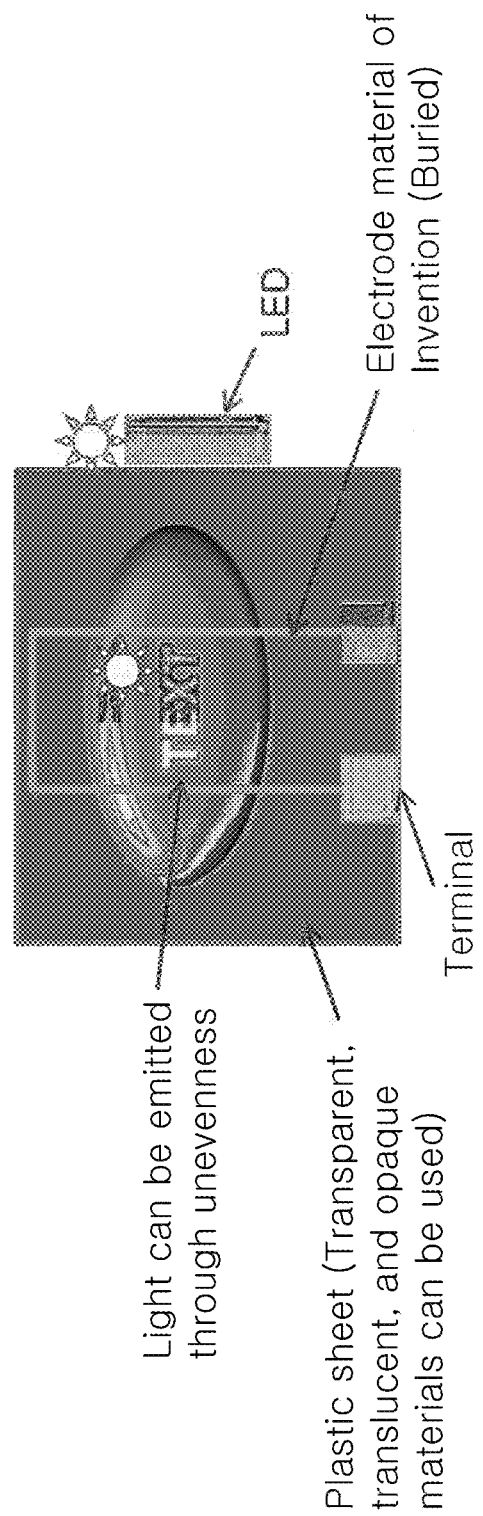
FIG. 5 is a schematic diagram illustrating a light-emission display switch employing an exemplary switch according to an exemplary embodiment of the present invention.

Particularly, LED illumination may obtain particular effects by using the present invention. A conventional switch employs a method in which an LED may be disposed around the switch, and then an illumination effect may be applied to an upper button by using a diffusion film. Accordingly, when the LED is employed, a switch may have a substantial thickness. However, according to an exemplary embodiment of the present invention, a transparent or translucent diffusion film may be used, and a step or unevenness may be applied to a surface portion. Accordingly, it light may emit to an entire area or a part thereof such as text through lateral illumination. The step or the unevenness may be formed by mechanical cutting, pressing, injection molding, or laser beam machining, without particular limitations to the processes. According to an present exemplary embodiment of the present invention, a light-emission display switch may be manufactured to have a thickness of 1 to 2 mm, which is substantially reduced from conventional switches in the related arts. Further, in the case of employing a transparent sheet, light may emit to a text portion through unevenness, and thus it the switch that can be attached to a window or a mirror (FIG. 4 and FIG. 5) may be manufactured. In addition, according to an exemplary embodiment of the present invention, a manufacturing process may be simplified as compared with the case of a conventional touch switch employing a transparent electrode, and it may be applied to curved glass.

According to another exemplary embodiment of the present invention, a manufacturing method of an ultra-thin switch may be provided. The method may include: preparing a paste including a substrate (flexible substrate), conductive particles, and a degradation inhibitor; coating the paste on a first surface or a second surface of the base substrate; and forming, by drying or curing the coated paste, a flexible electrode on the first surface or the second surface of the base substrate.

The degradation inhibitor may include one selected from the group consisting of a thioester-based compound, a hindered phenol-based compound, a hindered amine-based compound, a phosphite-based compound, and a combination thereof in the preparing of the paste including the flexible substrate, the conductive particles, and the degradation inhibitor.

The coating of the paste on one surface or opposite surfaces of the base substrate may be performed by using screen printing, printer printing, spray coating, dipping, or a combination thereof.

The forming of the flexible electrode on one surface or opposite surfaces of the base substrate by drying or curing the coated paste may be performed by heat curing or photo-curing.

The conductive particles may include one selected from the group consisting of carbon black, carbon nanotubes, graphene, fullerene, graphite, copper powder, silver powder, gold powder, nickel powder, and a combination thereof.

The base substrate include one selected from the group consisting of silicone resins, acryl-based resins, polyethylene terephthalate (PET), polyvinyl chloride (PVC), polyethylene (PE), polycarbonate (PC), poly(methyl methacrylate) (PMMA), acrylonitrile butadiene styrene (ABS), polypropylene (PP), polyimide (PI), polyamide/imide (PAI), polyphthalamide (PPA), an epoxy resin, and a combination thereof.

The flexible substrate may include one or more selected from the group consisting of polyester, polyurethane, silicone, nitrile-butadiene rubber (NBR), polyethylene terephthalate (PET), and an oligomer or monomer thereof.

The following exemplary embodiments illustrate the present invention in more detail. However, the following exemplary embodiments are for illustrative purposes only, and the scope of the present invention is not limited thereto.

EXAMPLE

Hereinafter, (material/composition) according to an exemplary embodiment of the present invention will be described with reference to the accompanying drawings.

Examples—Manufacturing Ultra-Thin Switch

Example 1

Carbon black (Ketjen Black (Lion Co. Ltd.)), natural graphite flakes (Aldrich), and silver powder (Aldrich) were prepared for conductive particles. A polyester resin (ES-120, SK Chemicals) were employed for a flexible substrate. TINUVIN® 770 (Ciba-Geigy) was used as a degradation inhibitor for preventing degradation of the resin.

To form an electrode, 20 vol % of the carbon black, 2 vol % of the silver powder, 30 vol % of the graphite, and 0.3 vol % of the degradation inhibitor were mixed with respect to a total of 100 vol % of the electrode, and the polyester resin was added thereto as the rest. Next, a mixing step was performed by using an agitator to form a paste of the mixture.

Next, the formed paste was coated on a PET film (LOTTE Chemical Corporation) by using a screen printing method.

Next, the paste was heated to a temperature of 130° C., an adhesive was coated on an upper portion thereof, and a PET film was covered thereon. Then, it was processed in a temperature of 150° C. to manufacture an ultra-thin switch having a thickness of 1 mm.

Example 2

An ultra-thin switch was manufactured by using the same method as Example 1, except that 20 vol % of the carbon black, 30 vol % of the graphite, and 0.3 vol % of the degradation inhibitor were mixed with respect to a total of 100 vol % of the electrode, and the polyester resin was added thereto as the rest.

Experimental Example

Experimental Example 1

Normal on-resistance and on-resistance in operation were measured by connecting a micro-resistance meter to opposite terminals of a thin-film electrode switch manufactured in Example 1 and Example 2.

Figure 3:
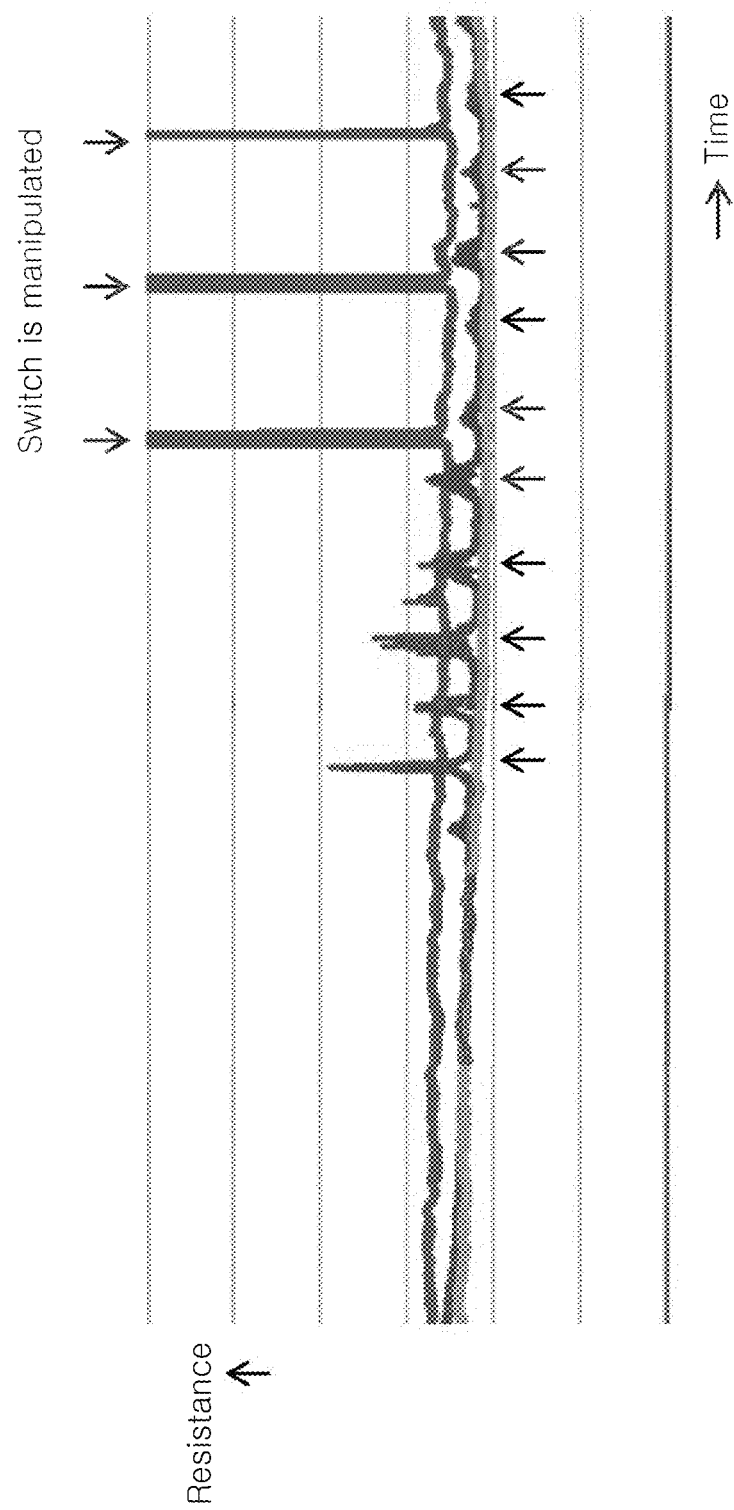
FIG. 3 is a graph illustrating results of on-resistance of an exemplary switch according to an exemplary embodiment of the present invention.

Measuring results are shown in the following Table 1 and FIG. 3. In FIG. 3, a red color indicates Example 1, and a blue color indicates Example 2. It was determined that the switch was normally operated.

TABLE 1

|  | Normal resistance (Ω) | Maximum resistance in operation (Ω) |
| --- | --- | --- |
| Example 1 | 10 | 19 |
| Example 2 | 13 | 30 or more |

Experimental Example 2

An LED was mounted at a side of an electrode structure manufactured in Example 1 and Example 2 to lead light diffusion into a PET film, and a black paint was coated on a surface of the switch. Then, a text portion was etched by using a laser to form unevenness. It was determined that light diffused at the LED was scattered at the unevenness to have an illumination effect.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A switch comprising:
   a base substrate; and
   an electrode disposed on a first surface or a second surface of the base substrate,
   wherein the electrode comprises:
   a substrate in an amount in a range of 5 to 70 vol %;
   conductive particles embedded in the substrate in an amount in a range of 29.9 to 94.9 vol %; and
   a degradation inhibitor in an amount in a range of 0.1 to 1 vol %,
   wherein all the vol % are based on a total of 100 vol % of the electrode.

2. The switch of claim 1, wherein a thickness of the switch is in a range of 0.5 to 3 mm.

3. The switch of claim 1, wherein the conductive particles comprises one selected from the group consisting of carbon black, carbon nanotubes, graphene, fullerene, graphite, copper powder, silver powder, gold powder, nickel powder, and a combination thereof.

4. The switch of claim 1, wherein the base substrate comprises one selected from the group consisting of silicone resins, acryl-based resins, polyethylene terephthalate (PET), polyvinyl chloride (PVC), polyethylene (PE), polycarbonate (PC), poly(methyl methacrylate) (PMMA), acrylonitrile butadiene styrene (ABS), polypropylene (PP), polyimide (PI), polyamide/imide (PAI), polyphthalamide (PPA), an epoxy resin, and a combination thereof.

5. The switch of claim 1, wherein the substrate comprises one or more selected from the group consisting of polyester, polyurethane, silicone, nitrile-butadiene rubber (NBR), polyethylene terephthalate (PET), and an oligomer and monomer thereof.

6. The switch of claim 1, wherein the degradation inhibitor comprises one selected from the group consisting of a thioester-based compound, a hindered phenol-based compound, a hindered amine-based compound, a phosphite-based compound, and a combination thereof.

7. The switch of claim 1, where the substrate is flexible, and the electrode is flexible.

8. A vehicle comprising the switch of claim 1.

* * * * *